Sept. 24, 1968 R. E. PACE ET AL 3,403,270

OVERVOLTAGE PROTECTIVE CIRCUIT FOR INSULATED GATE FIELD EFFECT TRANSISTOR

Filed June 1, 1965

INVENTOR.
ROBERT E. PACE
JAMES D. TROTTER
WARREN C. WHEELER
BY
ATTORNEY

United States Patent Office 3,403,270

Patented Sept. 24, 1968

3,403,270
OVERVOLTAGE PROTECTIVE CIRCUIT FOR INSULATED GATE FIELD EFFECT TRANSISTOR

Robert E. Pace, James D. Trotter, and Warren C. Wheeler, Sunnyvale, Calif., assignors to General Micro-Electronics Inc., Santa Clara, Calif., a corporation of Delaware Continuation-in-part of application Ser. No. 454,460, May 10, 1965. This application June 1, 1965, Ser. No. 460,164
4 Claims. (Cl. 307—304)

ABSTRACT OF THE DISCLOSURE

Overvoltage protective circuit for insulated gate fiela effect transistor (IGFET) comprising a second IGFET whose source-drain circuit is connected between the input terminals of the first IGFET and whose gate insulator's thickness and built-in charge are selected so that the second IGFET will undergo avalanche breakdown before the input voltage can become large enough to destroy the gate insulator of first IGFET.

The present invention relates in general to semiconductor devices and circuits, and more particularly to a protective device for obviating breakdown or rupture of the gate oxide or gate insulator of an insulated gate field-effect transistor.

This application is a continuation-in-part of our pending application entitled, "Protective Circuit for Insulated Gate Metal Oxide Semiconductor Field-Effect Devices," filed May 10, 1965, Ser. No. 454, 460, and now abandoned.

It has been discovered that a relatively high voltage or potential charge impressed across or applied to the gate electrode of an insulated gate field-effect transistor may cause rupture or breakdown of the gate oxide layer thereof.

Accordingly, an object of the present invention is to provide a protective device and circuit to eliminate the breakdown of the gate oxide of an insulated gate field-effect transistor.

Another object is to provide a protective device that will be temporarily activated to obviate permanent breakdown of the gate oxide of an insulated gate field-effect transistor.

A further object is to provide a device and circuit which protect the gate oxide of an insulated gate field-effect transistor from rupturing or breaking down when the gate oxide is subjected to a relatively high voltage.

Other and further objects and advantages of the present invention will be apparent to one skilled in the art from the following description taken in conjunction with the accompanying drawing, in which.

Figure 1:
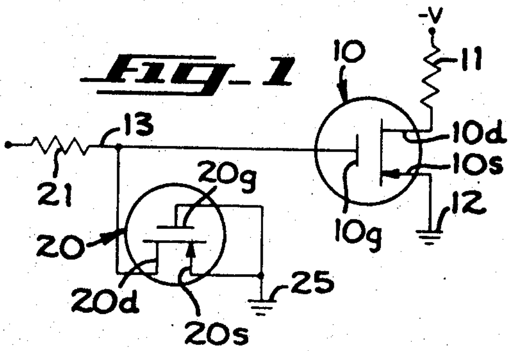
FIG. 1 is a schematic diagram illustrating an insulated gate field-effect device and a protective circuit with a field-effect device employed as a protective transistor.

FIG. 1 shows a conventional insulated gate field-effect transistor 10, which comprises a drain electrode 10*d*, a source electrode 10*s*, and a gate electrode 10*g*. Connected to the drain electrode 10*d* in a well known manner through a load resistor 11 is a bias source —V. The source electrode 10*s* is connected to ground at 12. Conventionally, a negative input signal is fed over an input conductor 13 to the gate electrode 10*g* of transistor 10.

Figure 2:
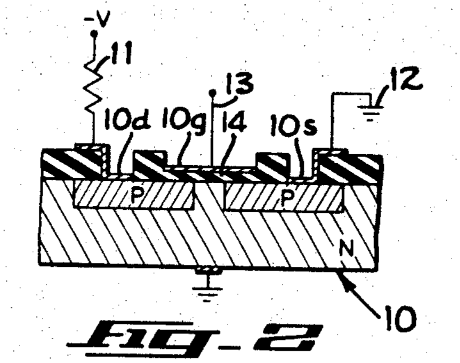
FIG. 2 is a cross-sectional view of an insulated gate field-effect transistor.

FIG. 2 shows a sectional view of transistor 10. Gate electrode 10*g* is formed in a conventional manner of aluminum and is disposed over an amorphous quartz insulating layer 14. Quartz layer 14 is an oxide of metal, such as silicon dioxide or silicon oxide.

It has been discovered that when a relatively high voltage is impressed across gate electrode 10*g*, a rupture of the adjacent portion of insulating layer 14 is likely to occur, resulting in a breakdown of transistor 10. Electrostatic charges of sufficient magnitude to rupture layer 14 can be built up easily due to the extremely high input impedance of transistor 10.

The gate to source threshold turn-on voltage ($V_{gst}$) for transistor 10 is controlled by the thickness of the portion of insulating layer 14 adjacent gate electrode 10*g*. This voltage, when applied to gate electrode 10*g* will reverse the conductivity type of that part of the N-type region immediately below gate electrode 10*g* so that conduction by majority carriers will be created between drain electrode 10*d* and the source electrode 10*s*. Field produced by the turn-on voltage is inversely proportional to the thickness of layer 14 so that as the thickness layer 14 increases, the turn-on voltage ($V_{gst}$) and the rupture voltage of layer 14 increases. Hence there is an optimum thickness for the portion of layer 14 which is adjacent to gate electrode 10*g*.

FIG. 1 also shows 20 which comprises a metal oxide semiconductor field-effect transistor, including a drain electrode 20*d*, a source electrode 20*s*, and a gate electrode 20*g*. Transistor 20 is shown in section in FIG. 3. Connected to the gate electrode 10*g* of transistor 10 is a drain electrode 20*d* of transistor 20. A voltage dropping resistor 21 may be connected in series with input conductor 13 to limit the current to transistor 20. The gate electrode 20*g* and the source electrode 20*s* of transistor 20 are connected to ground at 25. Hence when transistor 20 is conductive, ground potential will be applied to gate electrode 10*g* to limit the potential difference between gate electrode 10*g* and source electrode 10*s* to a magnitude insufficient to rupture insulating layer 14 of transistor 10. The source to drain circuit of transistor 20 is, therefore, connected in parallel with the gate electrode 10*g* and ground.

Figure 3:
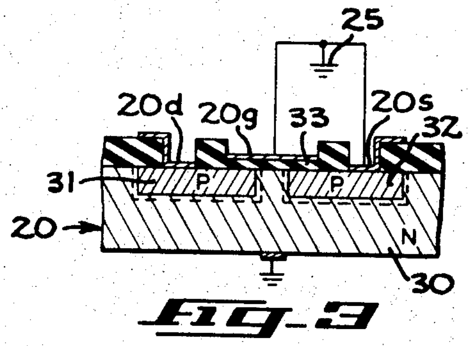
FIG. 3 is a cross-sectional view of the field-effect transistor which is employed as a protective device in FIG. 1.

As shown in FIG. 3, the transistor 20 is formed from a semiconductor body 30 of preferably N-type conductivity which includes a P-type drain region 31 and a P-type source region 32. The drain region 31 and the source region 32 are spaced apart adjacent the surface of body 30 which has insulating layer 33 of silicon oxide or silicon dioxide thereon. The avalanche breakdown voltage of transistor 20 depends upon its surface resistivity, which in turn is determined by the bulk impurity concentration, the charge which exists in the oxide, the potential applied to the metal gate over the avalanche region, and the thickness of insulating layer 33. Thus, by controlling the built-in charge in and the thickness of insulating layer 33, the avalanche breakdown voltage of the transistor 20 can be regulated. By reducing the built-in chrage in and the thickness of insulating layer 33 of the avalanche breakdown voltage of transistor 20 from source to drain can be reduced. This affords the opportunity of reaching the critical field strength for the avalanche breakdown voltage at a lower voltage.

When the potential on conductor 13 is below the avalanche breakdown voltage of transistor 20, transistor 20 will remain nonconductive and gate electrode 10*g* will be isolated from ground.

On the other hand when the potential on conductor 13 is equal to or in excess of the avalanche breakdown voltage, transistor 20 will conduct, presenting a low impedance path between ground and gate electrode 10*g*, thereby clamping gate electrode 10*g* below the breakdown voltage of the adjacent portion of layer 14.

Transistor 20 is formed with its gate oxide 33 of a predetermined thickness and built-in charge so that the avalanche breakdown voltage will be of a predetermined magnitude. The avalanche breakdown voltage will be less than the breakdown voltage of layer 14 of transistor 10. In the preferred embodiment, all of the elements shown in FIG. 1 will be formed in a single monolithic body or wafer.

Since transistor 20 will not conduct as long as the voltage on input conductor 13 is less than the breakdown voltage of layer 14, transistor 20 will not substantially affect the operation of transistor 10.

When the voltage on conductor 13 tends to increase to a magnitude that is equal to or in excess of the breakdown or rupture voltage of layer 14, transistor 20 will undergo an avalanche breakdown, providing a low impedance path between gate electrode 10*g* and ground. When the voltage on conductor 13 is reduced substantially below the breakdown voltage of layer 14, transistor 20 will be restored to its initial non-conductive state.

It is apparent that positive potentials may be employed if the conductivity types of the regions of transistors 10 and 20 are reversed. When reference is made to higher potentials, it is intended that relative absolute magnitudes will be applied. Ground as herein employed merely refers to a common circuit connection or reference potential level. A potential of higher negative potential is considered to be of higher magnitude and the converse is also true.

It is to be understood that modifications and variations of the embodiment of the invention disclosed herein may be resorted to without departing from the spirit of the invention and the scope of the appended claims.

We claim:

1. In the combination of:

(1) a protected electronic device arranged to receive and operate on input signals of a given voltage range supplied thereto between two input terminals thereof and which is susceptible of damage if the voltage of an input signal supplied thereto exceeds a predetermined value, which is beyond said given range, and (2) a voltage sensitive protecting means connected between said two input terminals and arranged to present (a) a relatively high impedance between said two input terminals so as not to affect said input signal and thereby not affect the operation of said protected device when the voltage of said input signal does not exceed said given range, and (b) a relatively low impedance between said two input terminals so as to reduce the voltage of said input signal and thereby protect said protected device when the voltage of said input signal exceeds said given range, the improvement wherein said voltage sensitive protecting means comprises a insulated gate field effect transistor having source and drain electrodes connected between said two input terminals, and an insulated gate electrode, said field effect transistor having a gate insulator whose thickness and built in charge are selected so that said field effect transistor will undergo an avalanche breakdown betwen the source and drain electrodes thereof when the voltage between said source and drain electrodes exceeds said given range.

2. The combination of claim 1 further including means directly connecting the gate electrode of said field effect transistor to one of the other electrodes thereof.

3. The combination of claim 1 wherein said protected device comprises an insulated gate field effect transistor, the gate electrode of which is one of said two input terminals.

4. The combination of claim 3 wherein the source-drain circuit of said protected transistor is connected in series with a load impedance and a bias source, the source and gate electrodes of said protecting transistor are connected to the source electrode of said protected transistor, and the drain electrode of said protecting transistor is connected to the gate electrode of said protected transistor.

References Cited

UNITED STATES PATENTS

| | | | |
|---|---|---|---|
| 3,213,299 | 10/1965 | Rogers | 307—88.5 |
| 3,229,218 | 1/1966 | Sickles et al. | 330—29 |
| 3,272,989 | 9/1966 | Sekely | 307—88.5 |
| 3,296,547 | 1/1967 | Sickles | 330—35 |
| 3,309,534 | 3/1967 | Yu et al. | 307—88.5 |

FOREIGN PATENTS 1,359,902 3/1964 France.

OTHER REFERENCES

Karlsbakk, "Field Effect Transistor Shift Register," IBM Technical Disclosure Bulletin, vol. 7, No. 1, June 1964, page 110.

JOHN W. HUCKERT, *Primary Examiner.*

R. F. SANDLER, *Assistant Examiner.*